Figure 1:
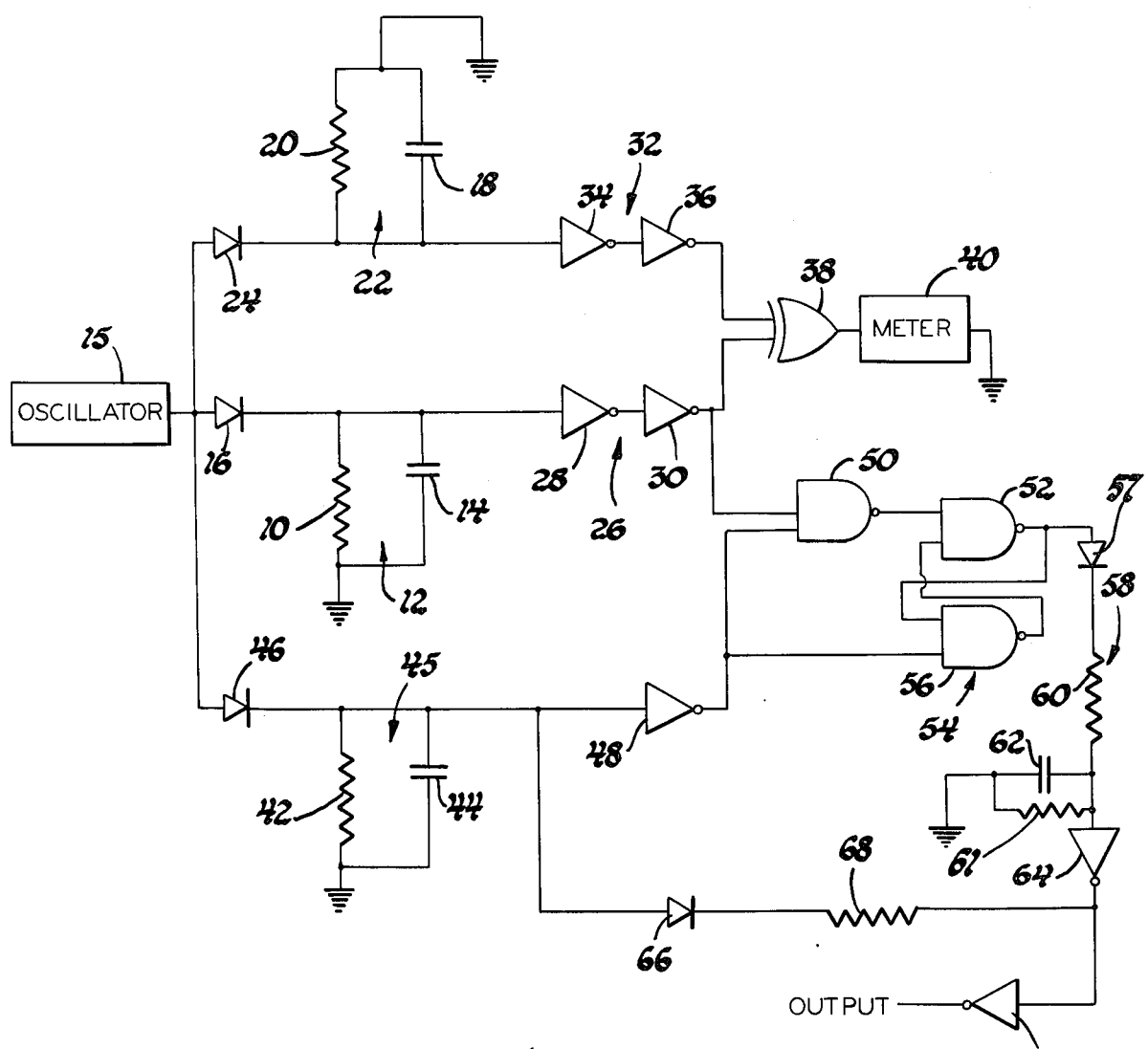

United States Patent
Rabe

[11] 4,065,721
[45] Dec. 27, 1977

[54] SOLID STATE THRESHOLD DETECTOR WITH HYSTERESIS

[75] Inventor: Paul R. Rabe, Sterling Heights, Mich.

[73] Assignee: General Motors Corporation, Detroit, Mich.

[21] Appl. No.: 741,729

[22] Filed: Nov. 15, 1976

[51] Int. Cl.² .................. H03K 5/20; H03K 7/08; H03K 7/10
[52] U.S. Cl. .................................. 328/1; 328/3; 328/127; 328/151; 328/141; 307/265; 307/271; 307/358
[58] Field of Search ................ 328/3, 4, 138, 150, 328/151, 1, 127, 140, 141; 307/265, 271, 358

[56] References Cited

U.S. PATENT DOCUMENTS

| | | | |
|---|---|---|---|
| 3,252,010 | 5/1966 | Buttenhoff | 328/3 X |
| 3,305,732 | 2/1967 | Grossman et al. | 328/138 X |
| 3,513,353 | 5/1970 | Lansch | 328/150 X |
| 3,546,612 | 12/1970 | Day | 328/4 X |

*Primary Examiner*—John S. Heyman
*Attorney, Agent, or Firm*—Howard N. Conkey

[57] ABSTRACT

An apparatus for providing an output digital signal when the magnitude of a monitored parameter is within a critical range. An oscillator repeatedly charges each of first and second capacitors to a predetermined voltage level. A monitoring resistor is parallel coupled with the first capacitor and has a resistance progressively changing with the magnitude of the parameter to define a rate of discharge of the first capacitor, between repeated chargings, determined by the parameter. A reference resistor is parallel coupled with the second capacitor and has a resistance equal to the resistance of the monitoring resistor when the magnitude of the monitored parameter is at the threshold of the critical range and defines a first reference rate of discharge of the second capacitor between repeated chargings. The voltages across the first and second capacitors are monitored by respective threshold detectors, each of which provides an output when the voltage across the respective capacitor exceeds a specified level. The outputs of the threshold detectors are coupled to a logic circuit which compares the duration of the outputs of the threshold detectors and generates an output when the duration of the output of the level detector monitoring the first capacitor varies from the time duration of the output of the level detector monitoring the second capacitor in a sense representing a critical magnitude of the condition. A circuit is responsive to the output of the logic circuit to couple a third resistor in parallel with the reference resistor to define a second reference rate of discharge of the second capacitor between repeated chargings so as to provide a hysteresis in the output signal from the logic circuit in response to variations of the monitored parameter.

3 Claims, 2 Drawing Figures

SOLID STATE THRESHOLD DETECTOR WITH HYSTERESIS

This invention relates to a threshold detector having hysteresis for providing an output when the magnitude of a monitored condition is within a critical range. The present invention has particular utility in a detector responsive to various parameters such as force, temperature, liquid level and position. For example, the present invention may be used in conjunction with a temperature responsive resistor for controlling the energization of a fan.

In copending application Ser. No. 608,076, filed Aug. 27, 1975, and assigned to the assignee of the present invention, there is described a solid state threshold detector which provides an output signal when the magnitude of a monitored parameter is within a critical range. The threshold detector of this invention is directed to the form of threshold detector described in the aforementioned copending application and in which hysteresis is provided.

It is the general object of this invention to provide an improved apparatus for providing an indication when the magnitude of a variable parameter monitored by a variable resistance-reactance circuit is within a critical range.

It is another object of this invention to provide a circuit for comparing the time constant of a variable resistance-reactance circuit responsive to a sensed parameter to the time constant of a reference resistance-reactance circuit to provide an indication when the magnitude of the sensed parameter is within a critical range and in which the time constant of the reference resistance-reactance circuit is shifted to provide for hysteresis.

These and other objects of this invention are accomplished by means of an oscillator which repeatedly charges each of first and second capacitors to a predetermined voltage level. A first resistor is parallel coupled with the first capacitor, one of which is variable in response to a monitored parameter to define a time constant and corresponding rate of discharge of the first capacitor between repeated chargings that is determined by the parameter. A reference resistor is parallel coupled with the second capacitor to define a time constant and corresponding rate of discharge of the second capacitor equal to the rate of discharge of the first capacitor when the monitored parameter is at the threshold of the critical range. A pair of threshold detectors monitors the voltage charge across the first and second capacitors and generates respective digital signals when the voltage magnitude exceeds a specified level. The output of each of the threshold detectors are coupled to a logic network which generates an output when the time duration of the pulses from the level detectors attained predetermined relationships representing the monitored parameter being in the critical range. A circuit is responsive to the output of the logic network to couple a third resistor in parallel with the reference resistor to vary the rate of discharge of the second capacitor to provide for hysteresis in the output of the logic circuit.

Figure 2:
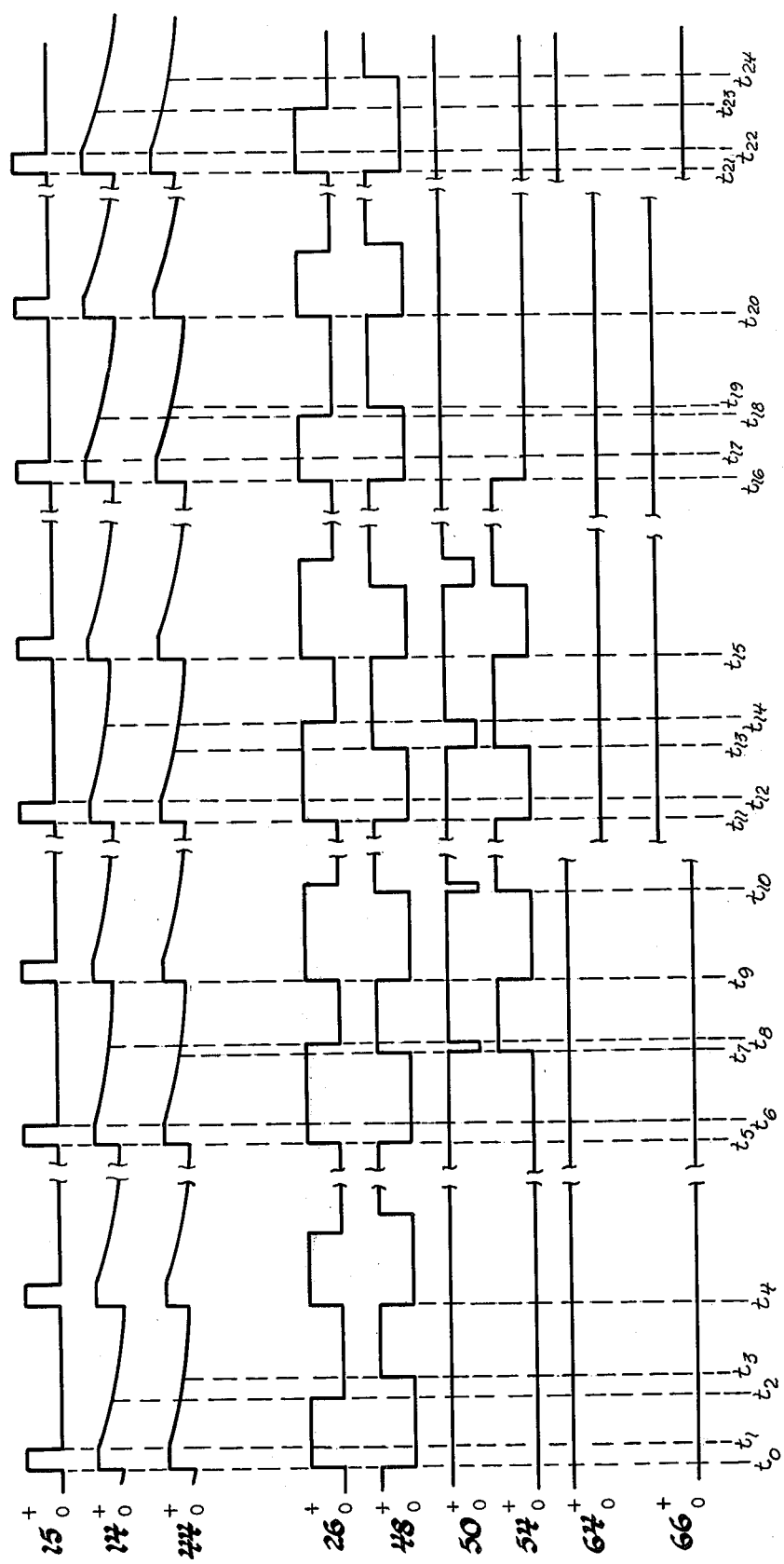

The invention may be best understood by reference to the following description of a preferred embodiment and the drawings in which:

FIG. 1 is a schematic diagram of the apparatus incorporating the principles of this invention; and FIG. 2 is a timing and voltage diagram for the apparatus of FIG. 1.

The preferred embodiment of this invention will be described with reference to a temperature monitoring apparatus using a positive temperature coefficient resistor for purposes of illustration. It is understood that the apparatus may be used to monitor other variable parameters, such as force or resistance, and further that the monitored parameter may be monitored by means of a variable capacitor or inductor. Further, in the preferred embodiment, reference to a digital logic 0 refers to ground potential and reference to a digital logic 1 refers to a positive voltage level.

Referring to FIG. 1, a temperature responsive resistor 10 monitors the temperature in an environment, the temperature of which is to be controlled, and presents a resistance which progressively changes with temperature. The temperature responsive resistor 10 may take the form of a positive temperature coefficient resistor whose resistance is a direct function of its temperature.

The temperature responsive resistor 10 forms a portion of a monitoring circuit 12 which includes a capacitor 14 parallel coupled with the resistor 10. An oscillator 15, having a low output impedance, generates repeated charge pulses which are applied to one side of the parallel combination of the resistor 10 and the capacitor 14 through a diode 16. The other side of the parallel combination of the resistor 10 and the capacitor 14 is grounded.

The charge pulses from the oscillator 15 are also applied to one side of the parallel combination of a reference capacitor 18 having a capacitance equal to the capacitance of the capacitor 14 and a reference resistor 20 in a reference circuit 22 through a diode 24. The remaining side of the parallel combination of the capacitor 18 and the resistor 20 is grounded.

The voltage across the capacitor 14 is coupled to the input of a threshold detector 26 comprised of series coupled inverters 28 and 30. The threshold level of the threshold detector 26 is determined by the trigger level of the inverter 28 which generates a digital logic 0 at its output when the magnitude of the voltage at its input exceeds the trigger level and generates a digital logic 1 when the voltage at its input is below its trigger level. The inverter 30 functions to invert the output of the inverter 28 such that the output of the threshold detector 26 is a digital logic 1 when the voltage across the capacitor 14 is above the trigger level of the inverter 28 and is a digital logic 0 when the voltage across the capacitor 14 is below the trigger level of the inverter 28.

The voltage across the capacitor 18 is coupled to the input of a threshold detector 32 identical to the threshold detector 26. The threshold detector 32 is comprised of series coupled inverters 34 and 36. When the voltage across the capacitor 18 exceeds the threshold or trigger level of the inverter 34, the output of the threshold detector 32 is a digital logic 1 and when the voltage charge is below the trigger level of the inverter 34, the output of the threshold detector 32 is a digital logic 0.

The inverters 28 and 34 are chosen such that they have a very high input impedance relative to the resistance of the resistor 20 and all resistance values of the temperature responsive resistor 10 and very low input capacitance relative to the capacitors 14 and 18.

The outputs of the inverters 26 and 32 are coupled to respective inputs of an EXCLUSIVE OR gate 38. The EXCLUSIVE OR gate 38 functions to generate a digital logic 1 when either one or the other but not both of the inputs thereof is at a digital logic 1.

The oscillator 15 and the remaining circuit elements are chosen such that each charge pulse output of the oscillator 15 has a duration sufficient to charge the capacitor 14 and the capacitor 18 to a level above the threshold level of the threshold detectors 26 and 32. During the periods between the charge pulses at the output of the oscillator 15, the diodes 16 and 24 present a very large impedance from the capacitor 14 and the capacitor 18 to the output of the oscillator 15 to prevent their discharge into the output of the oscillator 15. During this period between charge pulses, the capacitor 14 and the capacitor 18 discharge through the temperature responsive resistor 10 and the resistor 20. The rate of voltage decay on each of the capacitors 14 and 18 is a direct function of the time constants determined by the value of their capacitances and the resistances of the resistor 10 and the resistor 20. The oscillator 15 is further selected so that the period between charge pulses is of a sufficient duration so that for all expected values of the temperature responsive resistor 10, there is sufficient time for each of the capacitors 14 and 18 to discharge to a level below the threshold levels of the threshold detectors 26 and 32.

The resulting output of the EXCLUSIVE OR gate 38 is a series of digital logic 1 pulses, each of which has a time duration representing the difference between the resistances of the resistors 10 and 20 and consequently is related to the magnitude of the resistance of the temperature responsive resistor 10 and the temperature monitored thereby. This output is coupled to an integrating meter 40 which may be either digital or analog to provide a continuous indication of the temperature monitored.

Since the output of the EXCLUSIVE OR gate 38 represents the absolute magnitude of the difference in resistance between the temperature responsive resistor 10 and the reference resistor 20, the capacitors 14 and 18 being equal, the resistance of the reference resistor 20 must not be within the range of resistances of the temperature responsive resistor 10 in order to prevent an ambiguous indication of resistance and consequently temperature. Therefore, the resistance of the reference resistor 20 must be equal to or less than the lower limit of resistance of the resistor 10 or equal to or greater than an upper limit of resistance of the resistor 10, the upper and lower limits being determined by the minimum and maximum temperatures which are anticipated. As can be seen, by making the resistance of the reference resistor 20 equal to either the upper or lower limit of the resistance of the temperature responsive resistor 10, the zero level for a measuring circuit can be established.

To provide for an output indication or signal when the temperature monitored by the varible resistor 10 is within a critical range, a circuit is provided in FIG. 1 which may be used in conjunction with the circuit for providing a continuous indication of temperature or may be used independently thereof for providing an indication or control signal when the level is within a critical range. The circuit for providing the warning when the temperature is within the critical range includes the parallel combination of a reference resistor 42 and a reference capacitor 44 in a reference circuit 45. The capacitance of the capacitor 44 is equal to the capacitance of each of the capacitors 14 and 18. One side of the parallel combination of the resistor 42 and the capacitor 44 is grounded and the other side thereof is coupled to the cathode of a diode 46 whose anode is coupled to the output of the oscillator 15. The charge pulses from the oscillator 15 are thereby coupled across the parallel combination of the resistor 42 and the capacitor 44 through the diode 46 to charge the capacitor 44 to the level of the charge pulses.

The voltage across the capacitor 44 is coupled to the input of a threshold detector 48 which takes the form of an inverter that is identical to the inverters 28 and 34. The output of the threshold detector 48 is a digital logic 0 when the voltage charged across the capacitor 44 is above the trigger level thereof and is a digital logic 1 when the voltage across the capacitor 44 is below the trigger level thereof.

The output of the threshold detector 48 is coupled to one input of a NAND gate 50. The output of the threshold detector 26 is coupled to a second input of the NAND gate 50 whose output is coupled to one input of a NAND gate 52 in a latch circuit 54. The output of the NAND gate 52 is coupled to one input of a NAND gate 56 and the output of the NAND gate 56 is coupled to a second input of the NAND gate 52 to complete the latch circuit 54. The output of the threshold detector 48 is coupled to a second input of the NAND gate 56. The output of the latch circuit 54 at the output of the NAND gate 52 is coupled through a diode 57 to a filter circuit 58 comprised of a resistor 60 series coupled with the parallel combination of a resistor 61 and a capacitor 62 between the output of the NAND gate 52 and ground. The junction between the resistor 60 and the parallel combination of the resistor 61 and the capacitor 62 is coupled to the input of an inverter 64. The inverter 64 has a high input impedance and the resistance of the resistor 60 is less than the resistance of the resistor 61 so that the charging time constant of the capacitor 62 when the output of the NAND gate 52 is high is less than the discharge time constant of the capacitor 62 when the output of the NAND gate 52 is at ground. The diode 57 prevents the discharge of the capacitor 62 into the output of the NAND gate 52.

The output of the inverter 64 is coupled to the cathode of a diode 66 through a resistor 68. The anode of the diode 66 is coupled to the ungrounded side of the parallel combination of the resistor 42 and the capacitor 44. The output of the inverter 64 is also coupled to the input of an inverter 70 whose output comprises the output of the threshold circuit of this invention.

The inverter 64 supplies a digital logic 1 output when the voltage across the capacitor 62 is below the threshold level thereof and supplies a digital logic 0 or ground signal when the voltage across the capacitor 62 is above the trigger level thereof.

When the output of the inverter 64 is a digital logic 0, the resistor 68 is coupled in parallel with the resistor 42 in the reference circuit 45 so that the time constant of the reference circuit 45 and the associated rate of discharge of the capacitor 44 is determined by the capacitor 44 and the parallel combination of the resistors 42 and 68. When the output of the inverter 64 is a digital logic 1, the time constant of the reference circuit 45 is determined by the capacitor 44 and the resistor 42. The diode 66 blocks the digital logic 1 output of the inverter 64 from affecting the charge on the capacitor 44. The insertion of the resistor 68 in parallel with the resistor 42 when the output of the inverter 64 is a digital logic 0 provides the hysteresis in operation of the detector circuit of this invention.

The magnitude of the resistance of the resistor 42 is selected to be equal to the resistance of the temperature responsive resistor 10 when the temperature monitored thereby increases to the threshold of a critical level at which an output signal is desired. The NAND gate 50 functions to monitor the pulse width outputs of the threshold detector 26 and the threshold detector 48 and provides an output to the latched circuit 64 when the time duration of the digital logic 1 output of the threshold detector 26 varies from the time duration of the digital logic 0 output of the threshold detector 48 in a sense which represents that the magnitude of the resistor 10 is greater than the magnitude of the resistance parallel coupled with the capacitor 44, which is equal to the resistance of the resistor 42 when the output of the inverter 64 is a digital logic 1 and is equal to the parallel combination of the resistor 42 and the resistor 68 when the output of the inverter 64 is a digital logic 0.

The operation of the portion of the circuit of FIG. 1 directed toward the provision of the output signal representing the monitored temperature being within a critical range will be described with reference to the timing and voltage diagram of FIG. 2, the remaining portion of the circuit for providing a continuous indication of temperature being substantially identical to that described in the aforementioned copending application Ser. No. 608,076, the contents of which are hereby incorporated by reference.

At a time just prior to time $t_O$, it will be assumed that the temperature being monitored by the positive temperature coefficient resistor 10 is less than the critical magnitude, the output of the threshold detector 26 is a digital logic 0, the output of the threshold detector 48 is a digital logic 1, the output of the latching circuit 54 is a digital logic 0, and the voltage across the capacitor 62 in the filter 58 is at ground potential. Therefore, the output of the inverter 64 is a digital logic 1 so that the resistor 68 is not coupled in parallel with the resistor 42. Further, the output of the inverter 70 is a digital logic 0.

At time $t_O$, the oscillator 15 generates a charge pulse which is coupled across the capacitors 14 and 44 which are simultaneously quickly charged to the voltage value of the charge pulse and, which is above the threshold level of the threshold detectors 26 and 48, resulting in the output of the threshold detector 26 shifting to a digital logic 1 and the output of the threshold detector 48 shifting to a digital logic 0. The output of the NAND gate 50 remains a digital logic 1 and the output of the latch circuit 54 remains a digital logic 0.

At time $t_1$, the charge pulse at the output of the oscillator 15 shifts to ground potential and the capacitor 14 begins to discharge through the temperature monitoring resistor 10 at a rate determined by the time constant of the monitoring circuit 12 which is related to the temperature monitored by the resistor 10 and the capacitor 44 begins to discharge through the resistor 42 at a rate determined by the time constant of the reference circuit 45.

At time $t_2$, the voltage across the capacitor 14 decreases to the threshold level of the threshold detector 26 whose output shifts from a digital logic 1 to a digital logic 0.

At time $t_3$, the voltage across the capacitor 44 decreases to the threshold level of the threshold detector 48 whose output shifts to a digital logic 1.

At time $t_4$, the cycle previously described is repeated. As can be seen, the duration of the digital logic 1 output of the threshold detector 26 is less than the duration of the digital logic 0 output of the threshold detector 48 which represents that the temperature monitored by the temperature responsive resistor 10 is below the critical range represented by the time constant of the reference circuit 45. As long as the duration of the digital logic 1 output of the threshold detector 26 remains less than the duration of the digital logic 0 output of the threshold detector 48, the output of the NAND gate 50 remains a digital logic 1 and the output of the latch circuit 54 and the invertors 64 and 70 remain unchanged representing that the temperature monitored by the temperature responsive resistor 10 is below the critical magnitude.

To illustrate the operation of the circuit for providing an output signal when the temperature increases to a critical level above the threshold level determined by the time constant of the reference circuit 45, it will be assumed that prior to time $t_5$, the temperature monitored by the temperature sensing resistor 10 increases to above the threshold of the critical level, such that the resistance thereof increases to above the resistance of the resistor 42 so that the time constant of the monitoring circuit 12 is greater than the time constant of the reference circuit 45. During this condition, the duration of the digital logic 0 pulse output of the threshold detector 48 is less than the duration of the digital logic 1 pulse output of the threshold detector 26. At time $t_5$, the charge pulse from the oscillator 15 is coupled across the capacitors 14 and 44 which are quickly charged to the voltage level of the charge pulse resulting in the output of the threshold detector 26 shifting to a digital logic 1 and the output of the threshold detector 48 shifting to a digital logic 0.

At time $t_6$, the charge pulse at the output of the oscillator 15 shifts to ground potential and the capacitors 14 and 44 begin to discharge through the sensing resistor 10 and the resistor 42, respectively.

At time $t_7$, the voltage across the capacitor 44 decreases to the threshold level of the threshold detector 48 whose output shifts to a digital logic 1. At this time, both inputs to the NAND gate 50 are digital logic 1's so that the output thereof shifts to a digital logic 0. The output of the latch circuit 54 then shifts to a digital logic 1. The input to the NAND gate 56 from the threshold detector 48 at time $t_7$ is a digital logic 1 so that the output thereof shifts to a digital logic 0 to latch the output of the latch circuit 54 at a digital logic 1.

At time $t_8$, the voltage across the capacitor 14 decreases to the threshold level of the threshold detector 26 whose output shifts to a digital logic 0 to cause the output and of NAND gate 50 to shift to a digital logic 1. The output of the latching circuit 54 remains latched at a digitallogic 1.

During the time period the output of the latch circuit 54 is a digital logic 1, the capacitor 62 in the filter circuit 58 begins to charge through the resistor 60.

At time $t_9$, the oscillator 15 again supplies a charge pulse to charge the capacitors 14 and 44 to the voltage level of the charge pulse so that the output of the threshold detector 26 shifts to a digital logic 1 and the output of the threshold detector 48 shifts to a digital logic 0 to repeat the cycle beginning at time $t_5$. Also, at time $t_9$, the digital logic 0 input to the NAND gate 56 from the threshold detector 48 while the output of the NAND gate 50 is a digital logic 1 resets the latch circuit 54 to a digital logic 0. However, at time $t_{10}$, the output of the latch circuit 54 is again shifted to a digital logic 1 as previously described.

The output of the latch circuit 54 is a series of digital logic 1 pulses which charge the capacitor 62 through the diode 57 and the resistor 60. After a specified number of pulses determined by the time constant of the filter 58, the capacitor 62 is charged to the trigger level of the inverter 64 whose output shifts from a digital logic 1 to a digital logic 0. The output of the inverter 70 therefore shifts to a digital logic 1, which may be used, for example, to energize a fan to effect cooling of the environment whose temperature is being monitored by the temperature sensing resistor 10. Also, the shifting of the output of the inverter 64 to a digital logic 0 is effective to couple the resistor 68 in parallel with the resistor 42 in the reference circuit 45 so that the time constant thereof is decreased accordingly to decrease the digital logic 0 pulse width output of the threshold detector 48 and the critical temperature threshold represented thereby. Thereafter, and as long as the monitored temperature remains above the new lowered critical temperature threshold, the operation of the circuit as illustrated from time $t_{11}$ through $t_{15}$ is identical to the operation described from time $t_5$ through $t_9$ to maintain the output of the inverter 64 at a digital logic 0 and the output of the inverter 66 at a digital logic 1.

Subsequent to time $t_{15}$ and prior to time $t_{16}$, it is assumed that the temperature monitored by the temperature sensing resistor 10 decreases to below the lowered threshold repesented by the time constant determined by the capacitor 44 and the parallel resistors 42 and 68 in the reference circuit 45.

At time $t_{16}$, the charge pulse from the oscillator 15 charges the capacitors 14 and 44 resulting in the output of the threshold detector 26 shifting to a digital logic 1 and the output of the threshold detector 48 shifting to a digital logic 0. The output of the latching circuit 54 is at this time shifted to a digital logic 0 as before.

At time $t_{17}$, the capacitors 14 and 44 discharge through the temperature responsive resistor 10 and the resistors 42 and 68, respectively.

At time $t_{18}$, the voltage across the capacitor 14 decreases to the threshold level of the threshold detector 26 whose output shifts to a digital logic 0. At $t_{19}$, the voltage across the capacitor 44 decreases to the threshold level of the threshold detector 48 whose output shifts to a digital logic 1. The output of the NAND gate 50 is maintained at a digital logic 1 and the output of the latching circuit remains a digital logic 0. Therefore, the capacitor 62 begins to discharge through the resistor 61.

At time $t_{20}$, the charge pulse is again generated by the oscillator 15 and the cycle beginning at time $t_{16}$ is repeated.

After a predetermined time period and prior to time $t_{21}$, the capacitor 62 discharges through the resistor 61 to below the threshold level of the inverter 64 whose output shifts to a digital logic 1 to shift the output of the inverter 70 to a digital logic 0 and thereby deenergize the fan motor. Further, the resistor 68 is no longer in parallel with the resistor 42 so that the time constant of the reference circuit 45 again is increased to the original value to decrease the time rate of discharge of the capacitor 44 and thereby increase the duration of the logic 0 output of the inverter 48. This is illustrated beginning at time $t_{21}$ wherein the cycle of operation is identical to the cycle of operation beginning at time $t_1$.

As can be seen from the foregoing description, the selective coupling of the resistor 68 in parallel with the resistor 42 provides for hysteresis in the threshold level detector.

Although a specific logic circuit has been illustrated for comparing the pulse widths from the threshold detectors 26 and 48, other logic elements such as AND gates, NOR gates, and OR gates may be utilized in a manner which would be obvious to one skilled in the art. Further, the provision of increasing the time constant of a circuit by increasing the resistance in parallel with the capacitor in the reference circuit upon the attainment of a critical level to provide for hysteresis versus the decrease in the time constant of the reference circuit is contemplated.

The preferred embodiment of the invention was described using a variable resistor providing a resistance varying in accord with a parameter. The circuit may also be used with a variable capacitor sensor whose capacitance represents the value of a monitored parameter or an inductor whose inductance represents the value of a monitored parameter.

The detailed description of the preferred embodiment of the invention for the purpose of explaining the principles thereof is not to be considered as limiting or restricting the invention, since many modifications may be made by the exercise or skill in the art without departing from the scope of the invention.

I claim:

1. A threshold detector circuit having a setpoint with hysteresis for providing an output representing the critical magnitude of a condition, the circuit comprising:

a monitoring circuit having a first reactance element and a first resistor, at least one of which varies in accordance with the magnitude of the condition to define a monitoring circuit time constant determined by the magnitude of the condition, the monitoring circuit time constant varying in a predetermined sense from a critical time constant when the magnitude of the condition is critical;

a reference circuit having a second reactance element and a second resistor defining a first reference circuit time constant equal to the critical time constant;

means effective to repeatedly set a predetermined voltage across the first and second reactance elements in unison, the voltage across the first and second reactance elements varying after each repeated setting at rates determined by the respective time constants of the monitoring and reference circuits;

first level detector means responsive to the voltage across the first reactance element effective to produce a first series of digital pulses, each digital pulse in the first series having a duration related to the monitoring circuit time constant;

second level detector means responsive to the voltage across the second reactor effective to produce a second series of digital pulses, each digital pulse in the second series having a duration related to the reference circuit time constant and which represents the threshold detector setpoint;

output circuit means coupled to the first level detector means and the second level detector means effective to initiate a digital output signal representing a critical magnitude of the condition when the duration of the digital pulses in the first series differs from the duration of the digital pulses in the second series in a sense representing the monitoring circuit time constant varying in the predetermined sense from the critical time constant and terminating the digital output signal when the duration of the digital pulses in the first series again equals the duration of the digital pulses in the second series;

a third resistor; and means responsive to the digital output signal effective to couple the third resistor in parallel with the second resistor for the duration of the digital output signal, the second reactance element and the second and third resistors defining a second reference circuit time constant during the period of the digital output signal that is different from the critical time constant in a sense opposite the predetermined sense, the duration of the digital pulses in the second series being varied upon the provision of the digital output signal so as to provide for hysteresis in the threshold detector setpoint.

2. A threshold detector circuit having a setpoint with hysteresis for providing an output representing the critical magnitude of a condition, the circuit comprising:

a monitoring circuit having a first reactance element and a first resistor, at least one of which varies in accordance with the magnitude of the condition to define a monitoring circuit time constant determined by the magnitude of the condition, the monitoring circuit time constant being greater than a critical time constant when the magnitude of the condition is critical;

a reference circuit having a second reactance element and a second resistor defining a first reference circuit time constant equal to the critical time constant;

means effective to repeatedly set a predetermined voltage across the first and second reactance elements in unison, the voltage across the first and second reactance elements varying after each repeated setting at rates determined by the respective time constants of the monitoring and reference circuits;

first level detector means responsive to the voltage across the first reactance element effective to produce a first series of digital pulses, each digital pulse in the first series having a duration related to the monitoring circuit time constant;

second level detector means responsive to the voltage across the second reactance element effective to produce a second series of digital pulses, each digital pulse in the second series having a duration related to the reference circuit time constant and which represents the threshold detector setpoint;

output circuit means coupled to the first level detector means and the second level detector means effective to initiate a digital output signal representing a critical magnitude of the condition when the duration of the digital pulses in the first series becomes greater than the duration of the digital pulses in the second series representing the monitoring circuit time constant being greater than the critical time constant and terminating the digital output signal when the duration of the digital pulses in the first series again equals the duration of the digital pulses in the second series;

a third resistor; and means responsive to the digital output signal effective to couple the third resistor in parallel with the second resistor for the duration of the digital output signal, the second reactance element and the second and third resistors defining a second reference circuit time constant during the period of the digital output signal that is less than the critical time constant, the duration of the digital pulses in the second series being decreased upon the provision of the digital output signal so as to provide for hysteresis in the threshold detector setpoint.

3. A threshold detector circuit having a setpoint with hysteresis for providing an output representing the critical magnitude of a condition, the circuit comprising:

a monitoring circuit having a first capacitor and a first resistor parallel coupled with the capacitor, at least one of which varies in accordance with a parameter to define a monitoring circuit time constant determined by the parameter, the monitoring circuit time constant increasing from a critical time constant when the magnitude of the condition is critical, one side of the parallel coupled first capacitor and first resistor being coupled to ground reference potential;

a reference circuit having a second capacitor and a second resistor parallel coupled with the second capacitor defining a first reference circuit time constant equal to the critical time constant, one side of the parallel coupled second capacitor and second resistor being coupled to ground reference potential;

means effective to repeatedly charge the first and second capacitors in unison to a predetermined voltage relative to ground reference potential, the voltages across the first and second capacitors decreasing after each repeated setting at rates determined by the respective time constants of the monitoring and reference circuits;

first level detector means responsive to the voltage across the first capacitor effective to produce a first series of digital pulses, each digital pulse in the first series having a duration related to the monitoring circuit time constant;

second level detector means responsive to the voltage across the second capacitor effective to produce a second series of digital pulses, each digital pulse in the second series having a duration related to the reference circuit time constant and which represents the threshold detector setpoint;

output circuit means coupled to the first level detector means and the second level detector means effective to normally provide a voltage signal at its output having a magnitude equal to the predetermined voltage and to initiate a ground reference potential signal at its output representing the critical magnitude of the condition when the duration of the digital pulses in the first series becomes greater than the duration of the digital pulses in the second series representing the monitoring circuit time constant being greater than the critical time constant and reinitiating the voltage signal at its output when the duration of the digital pulses in the first series again equals the duration of the digital pulses in the second series; and a series circuit including a diode and a third resistor coupled between the ungrounded side of the parallel coupled second resistor and second capacitor and the output of the output circuit means, the diode being poled to discharge the second capacitor through the third resistor when the output circuit means provides the ground reference potential signal, the second and third resistors and the second capacitor defining a second reference circuit time constant less than the first reference circuit time constant during the period of the ground reference potential signal from the output circuit means, the duration of the digital pulses in the second series being varied upon the provision of the ground reference potential signal so as to provide for hysteresis in the threshold detector setpoint.

* * * * *